United States Patent [19]

Forchert et al.

[11] Patent Number: 5,396,422
[45] Date of Patent: Mar. 7, 1995

[54] METHOD FOR DETECTING MALFUNCTIONS IN A MOTOR VEHICLE

[75] Inventors: Thomas Forchert, Stuttgart; Ulrich Visel, Ostfildern; Günter Knörzer, Sachsenheim; Erwin Wüchner, Altbach; Siegfried Loos, Weinstadt, all of Germany

[73] Assignee: Mercedes-Benz AG, Germany

[21] Appl. No.: 844,827

[22] Filed: Mar. 2, 1992

[30] Foreign Application Priority Data

Mar. 2, 1991 [DE] Germany .................. 41 06 717.7

[51] Int. Cl.⁶ ............................................ G06F 11/32
[52] U.S. Cl. .................... 364/424.03; 364/551.01; 364/424.04; 340/438
[58] Field of Search .......... 364/424.03, 424.04, 364/431.01, 431.11, 550, 551.01; 340/438, 439; 73/117.2, 117.3

[56] References Cited

U.S. PATENT DOCUMENTS

| 4,267,569 | 5/1981 | Baumann et al. | 364/424.04 |
| 4,404,639 | 9/1983 | McGuire et al. | 364/424.04 |
| 4,534,214 | 8/1985 | Takahashi | 73/117.3 |
| 4,694,408 | 9/1987 | Zaleski | 364/431.01 |
| 4,757,463 | 7/1988 | Ballou et al. | 364/424.04 |
| 4,796,206 | 1/1989 | Boscove et al. | 364/431.01 |
| 4,839,811 | 6/1989 | Kanegae et al. | 364/424.03 |
| 5,010,487 | 4/1991 | Stonehocker | 364/431.01 |
| 5,081,598 | 1/1992 | Bellows et al. | 364/550 |

FOREIGN PATENT DOCUMENTS

| 0041741 | 12/1981 | European Pat. Off. . |
| 0325960 | 8/1989 | European Pat. Off. . |
| 2942133 | 10/1979 | Germany . |
| 3121645 | 5/1981 | Germany . |
| 56-014743 | 5/1981 | Japan . |
| 61-105251 | 9/1986 | Japan . |
| 63-185671 | 12/1988 | Japan . |
| 2125577A | 3/1984 | United Kingdom . |
| 83/02836 | 8/1983 | WIPO . |

OTHER PUBLICATIONS

Bosch-Prospekt IA4/VPT WAW 4566 D-588-30g, "Pocket System Tester-KTS 300"; pp. 1-8.
Bosch-Pruftechnik, "Neues Diagnosegerat fur Kraftfahrzeugwerkstten: Motortester MOT 300 und Zundungsoszilloskop MOT 400", pp. 36-45.
VDI-Berichte Nr. 687, "Moglichkeiten komfortabler Testtgeraten im Kraftfahrzeug", pp. 365-385.

Primary Examiner—Gary Chin
Attorney, Agent, or Firm—Evenson, McKeown, Edwards & Lenahan

[57] ABSTRACT

A method for detecting malfunctions in a motor vehicle, in which data words formed in subassemblies (sensors or components) upon detection of a malfunction therein are read by an analysis unit. The data words are also formed by the subassemblies when a malfunction detected by a peripheral subassembly is not traceable to said subassembly. Functional chains are determined in a device on the basis of the malfunctions detected by the subassemblies and represented by the corresponding data words. The functional chains contain all the sources of error related to the malfunctions. A list of test steps is drawn up in the device and stored at memory locations provided for this purpose. The test steps allow checking all the sources of error, and the functional chain is completely checked after execution of the test steps.

17 Claims, 4 Drawing Sheets

METHOD FOR DETECTING MALFUNCTIONS IN A MOTOR VEHICLE

The invention relates to a method for detecting malfunctions in a motor vehicle.

A generic method has been disclosed (DE 3,121,645 C2) according to which a data word which can be read by a diagnostic unit is formed with reference to a sensor or a component installed in a vehicle when an error-indicative condition has been detected; that is, when the output signal of the sensor or the component falls outside a range specified of values. It is also possible to detect errors which occur only sporadically and are not present when the diagnostic unit is connected. It is then proposed to replace the sensor when the diagnostic unit has detected that the error-indicative condition has occurred during operation.

It is an object of the present invention to provide a method for detecting malfunctions in a motor vehicle in such a way that as precise as possible a determination of the defective component can be made, the aim being at the same time to keep the outlay in maintaining the vehicle as low as possible.

This and other objects and advantages are achieved by the method for detecting malfunctions in a motor vehicle according to the invention, in which available information relating to the vehicle is used to generate a list of test steps by which it can be concluded that all malfunctions have been detected and corrected in the vehicle. The sequence of test steps is optimized in the sense that steps that would otherwise be carried out several times (because they relate to more than one subassembly) are carried out only once. Furthermore, the list of steps also includes a check of subassemblies in which the occurrence of a malfunction cannot be detected automatically (and hence, no change can take place in a subassembly data word characterizing the malfunction).

Advantages of the invention by comparison with the known prior art are that malfunctions can be precisely localized and virtually all functions can be checked for freedom from faults. In a particularly advantageous embodiment, the subassemblies can be checked by, for example, using a specific distance covered by the vehicle since the last check as the criterion for the need for a check of said individual subassemblies.

In a further preferred embodiment, it can be provided that the test steps are carried out in a sequence such that the first to be executed are those which relate to sources of error for which the probability of malfunctions is higher than for other sources of error. The probabilities can be determined, for example, by temporarily or permanently connecting the devices for carrying out the method to a central computer. Once a process of repair or maintenance on a vehicle is determined, the corresponding device transmits to the central computer the source of error constituting the cause of the malfunction. On the basis of said data transmitted by the devices, it is therefore possible to determine from the frequency of the occurrence of specific malfunctions the probabilities of the occurrence of future malfunctions caused by specific sources of error. If, in turn, a vehicle is to be tested, it is possible on the basis of transmitting the corresponding data of the central computer for the diagnostic unit to process the specific values of the probabilities at the same time during the sequence of test steps.

If test steps remain to be executed which are possibly to be carried out on the basis of a malfunction of the same source of error, it is possible to reset the data words of the corresponding sensors or components, and by bringing about the error-setting condition, to test whether the malfunction is detected in turn for said corresponding sensors or components.

It is also possible to record and store data concerning the operating environment when a malfunction is detected in a sensor or a component during the operation of the motor vehicle. The environmental data can then be read during the maintenance of the device. Consequently, it is possible to find the cause of sources of error which constitute the cause of malfunctions and are effective only under specific operating conditions such as, for example, when the engine is cold.

Other objects, advantages and novel features of the present invention will become apparent from the following detailed description of the invention when considered in conjunction with the accompanying drawings.

DETAILED DESCRIPTION OF THE DRAWINGS

Figure 1:
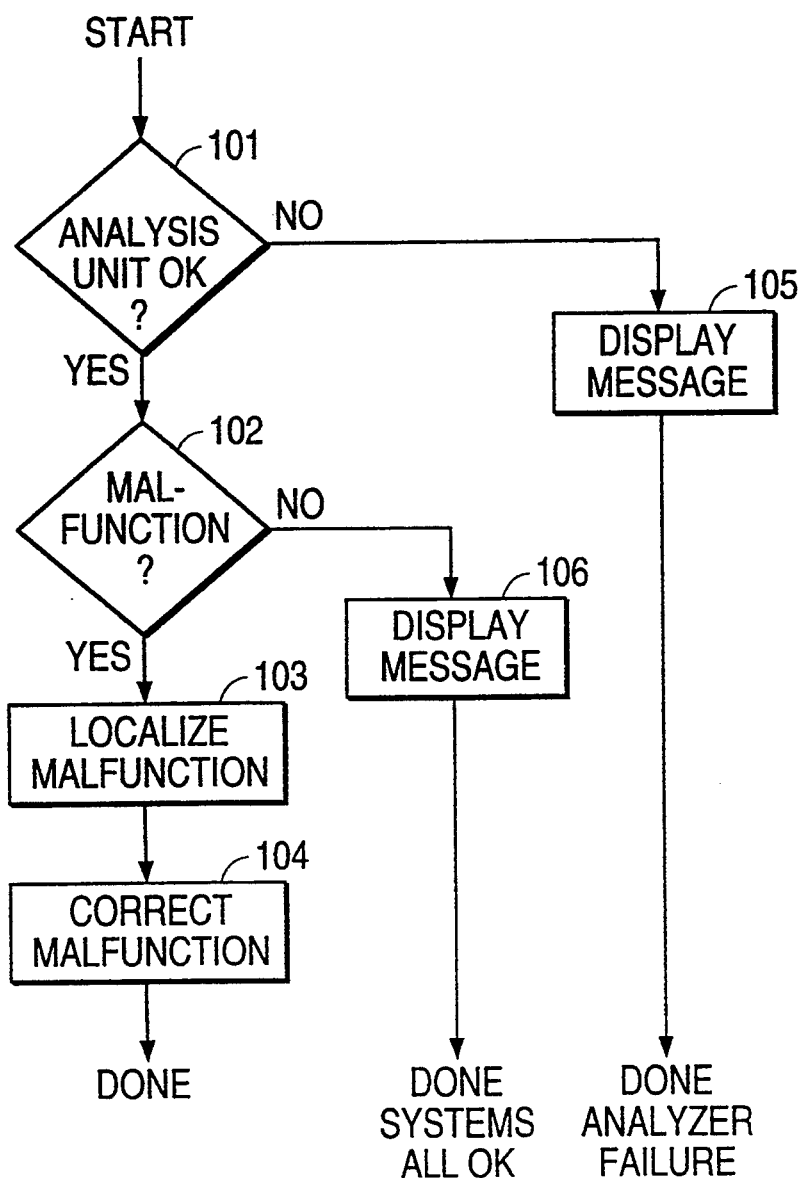
FIG. 1 is a flow chart which shows an exemplary embodiment of the method according to the invention.

As may be seen from FIG. 1, the method according to the invention for detecting malfunctions in a motor vehicle is advantageously subdivided into three parts. In a first step 101, a self-test checks whether the analysis unit 701 (FIG. 7) for carrying out the method is itself working without malfunctions. If not, an error message is displayed (step 105), and the sequence is terminated.

Otherwise, an initial test is performed at a step 102 to determine which components or sensors, designated below as subassemblies, have experienced a malfunction since the method was last carried out. If no malfunction is detected (i.e. if the vehicle is entirely in order), the method is concluded with the output of a corresponding message in the step 106. For this purpose, the data words characterizing detected malfunctions of the respective subassemblies are read and evaluated by the analysis unit 701, and a list of test steps is drawn up in the analysis unit 701 (FIG. 7) from the information available on the motor vehicle, based on the read and stored data words and on the subassemblies in which the occurrence of a malfunction cannot be automatically detected.

If during the execution of the list of test steps at least one malfunction has been detected (step 102), the localization of the malfunction is undertaken in a step 103 in a third part of the method according to the invention. Correction of the localized malfunctions is then prompted in a step 104 by a corresponding display. As a result, the method is then likewise concluded.

Figure 2:
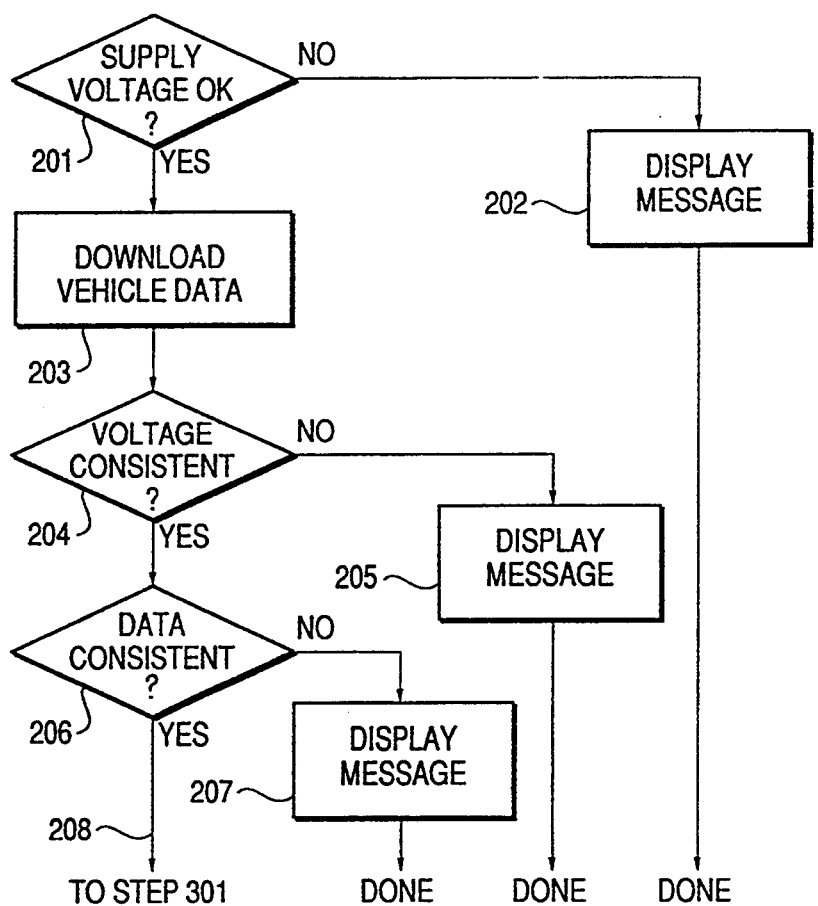
FIGS. 2 through 6 show more detailed flowcharts of parts of the method corresponding to FIG. 1.

FIG. 2 shows the sequence of steps executed in the analysis unit self-testing phase 101 of FIG. 1. Step 201 checks whether the supply voltage of the analysis unit is in a predetermined range (i.e. between two specific threshold values), which can be 80% and 120% of the nominal value of the supply voltage, for example. If so, a transition to the step 203 takes place. Otherwise, a message is output in the step 202 indicating that the storage battery of the analysis unit must be connected to a charger, which can be present externally in the workshop. It is also possible, of course, to charge the storage battery of the device during operation by connecting it to the vehicle battery of the vehicle to be checked. The analysis unit may also be operated without a storage battery, of course, by providing energy directly from the vehicle battery.

The information necessary to carry out the method according to the invention for all different types of vehicles could be stored directly in the analysis unit. However, this is relatively expensive for the very large number of types of vehicles, so that it is advantageous to store in the analysis unit only the data required for the particular vehicle that is to be checked at the time. As a result, the analysis unit becomes smaller and lighter and is thus better suited for use in workshops. Furthermore, it is possible for changes arising in connection with model development to be taken into account particularly easily for individual types of vehicle.

Storage in the analysis unit of the data required to check the vehicle can be performed in accordance with step 203 by connecting the analysis unit temporarily or permanently to a central computer in such a way that data for the particular vehicle, which is in the central computer, is transmitted to the analysis unit. Likewise, the data required for checking the vehicle can be passed to the analysis unit by plugging a test module, which contains the required data.

In the first mentioned case, updating can be performed by correcting the data in the central computer and then automatically transmitting the updated data to a corresponding analysis unit during a subsequent transmission. In the second case, it is necessary to send test modules to the workshops for all sorts and types of vehicles concerned. All corresponding test modules must thus be updated or exchanged during updating.

Since in accordance with the step 203 the data required for checking the vehicle is now present in the analysis unit, a first consistency test is carried out in the step 204 on the basis of the voltage of the vehicle battery network. The type of the vehicle to be checked is derived from the data present in the analysis unit to establish whether the voltage of the vehicle network of the vehicle must be in the tolerance band around the value of 12 V or in the tolerance band of 24 V. If the measured value of the voltage of the vehicle battery network is not in the indicated tolerance band, it is concluded that there is an inconsistency between the data present in the analysis unit and the vehicle to be checked. The method according to the invention is terminated by means of a corresponding error message in the step 205.

Subsequently, the step 206 checks whether the data present in the analysis unit is consistent with the type of vehicle to be tested; that is, whether the vehicle connected to the analysis unit via the diagnostic line or diagnostic lines can be examined by means of the data present in the analysis unit. If not, the method is terminated by means of a corresponding error message in the step 207. This check can be performed, for example, by filing in a control unit of the vehicle at least one data word which must coincide with one or more data words stored in the analysis unit.

If the interrogation in the step 206 is answered by "yes", a transition to the second part of the method according to the invention takes place in accordance with the arrow 208.

Figure 3:
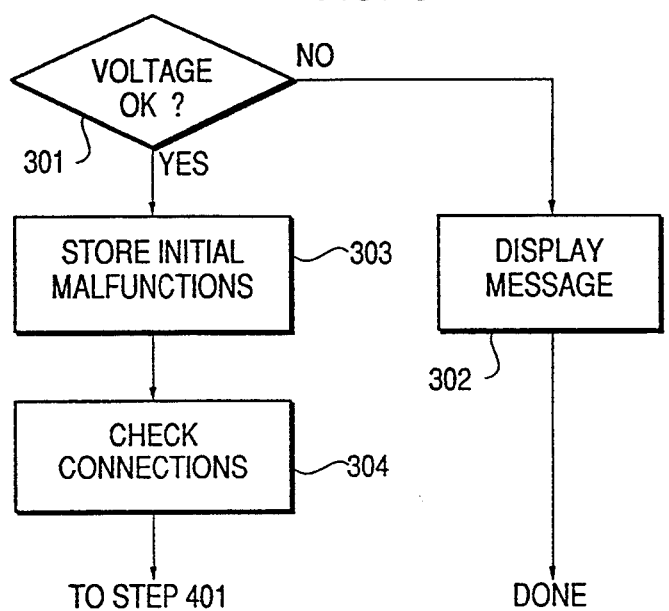

FIG. 3 shows an exemplary embodiment for the second part of the method according to the invention. Since an adequate supply voltage is required for proper functioning of all electronic components, the vehicle network voltage is first checked in step 301 to verify that it is between two specific threshold values. (If the energy supply of the analysis unit is provided directly from the vehicle network or the analysis unit storage battery, this step 301 coincides with the step 201 of the first part of the method in accordance with FIG. 2). If the vehicle network voltage is too low, an error message is displayed at the step 302 together with treatment and remedial measures. The method is then terminated at least provisionally.

During the check, it is likewise expedient in the step 301 to perform a test of the analysis unit 701 (FIG. 7) by selecting circuit elements on a sample basis and checking their functioning.

Since various cables have to be removed when localizing and correcting malfunctions that have arisen or are arising during self-testing, further malfunctions can appear which are not genuine malfunctions. To distinguish such false "malfunctions" from genuine malfunctions, the data words which indicate malfunctions in subassemblies are stored in the analysis unit at the step 303 at the start of the method according to the invention, and localization of malfunctions is undertaken only on the basis of those data words so stored at the start of testing.

The type of the vehicle to be checked can be ascertained from the data present in the analysis unit. The data words of the subassemblies of the standard equipment present in such vehicle type must be readable in order to permit data transmission by the device. Consequently, a further malfunction is detected in accordance with the step 304 when the analysis unit cannot read out data words from subassemblies belonging to the standard equipment of the type.

Figure 4:
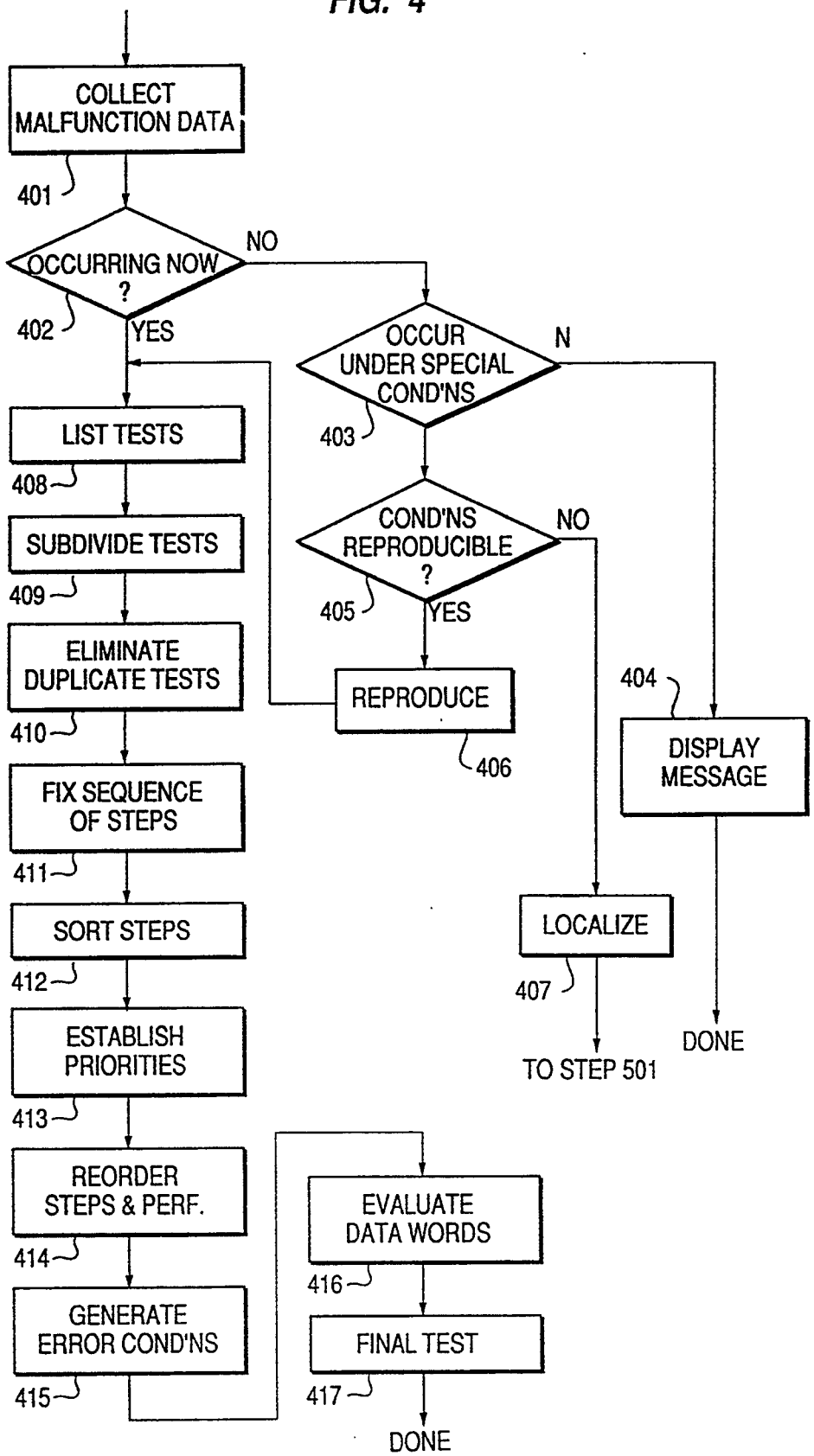

FIG. 4 shows an exemplary embodiment for the third part of the method according to the invention, in which a detailed localization of the malfunctions that have occurred or are occurring is to be performed. It is important to be able to determine from the content of the data word not only that a malfunction of a specific subassembly has been detected, but also to extract detailed data on the nature of the malfunction. Thus, in addition to an indication of the subassembly it relates to, the data word also contains a characterization of the malfunction that has occurred, the frequency with which it has occurred, whether it is also occurring at the time and, if necessary, environmental data at the time of occurrence, (for example, a localization of the range of values of the sensor which is malfunctioning, or further peripheral data such as, for example, the ambient temperature).

A test is performed at the step 402 to determine whether the malfunction is currently occurring. If the malfunction is not occurring, a further determination is made in step 403 by reference to the stored environmental data, whether the malfunction occurs only under specific operating conditions. If not, there is probably a loose connection, whereupon a list of the connections for which the malfunction is detected is drawn up in the step 404.

Figure 5:
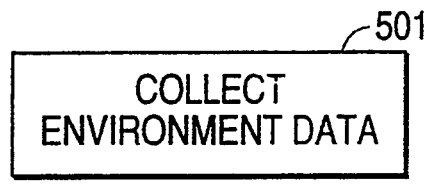

If, on the other hand, the malfunction does occur only under specific operating conditions, it is determined in step 405 whether those specific operating conditions can be reproduced. If so, further checking by means of the step 408 is performed (see below) after producing these operating conditions in the step 406. If the specific operating conditions cannot be produced, an attempt is made in the step 407 to localize the malfunction more precisely with reference to the environmental data. If this is also impossible, further processing, which is set forth in more detail in FIG. 5, is performed.

On the basis of the data words, a list is drawn up in the step 408 of all test steps necessary to determine possible subassembly malfunctions, taking into account all conceivable causes of error on the basis of a data word indicating a malfunction. The test steps necessary for checking such subassemblies are then included in the list, as illustrated by the following example:

Assume that the vehicle speed is derived by means of inductive wheel speed sensors, the output signals of which are passed to a control unit for an antiblock system (ABS) via a data line. A value of the vehicle speed derived in the ABS control unit from said output signals is then passed via further data lines to other control units such as, for example, a control unit for an acceleration skid control (ASR) and/or to a control unit for controlling the internal-combustion engine. In such a system various sources of error are conceivable.

If a data word indicates a malfunction of the control unit of the ABS in that the derived value of the vehicle speed is defective, the following functional chain is established to generate the list of test steps:
the inductive speed sensor;
the data line for transmitting the output signals of the sensor to the ABS control unit, as well as the connections of said data line to the sensor and the control unit; and
the ABS control unit itself.

The above list, it should be noted, includes not only a check of the ABS controller itself but also those subassemblies which are functionally related, or peripheral, to the ABS controller, in the sense that a malfunction of one of them could cause an error indicative condition in the controller itself.

If, on the other hand, a data word indicates a malfunction of the control unit of the ASR in that the value of the vehicle speed is defective, the following are included in the functional chain to generate the list of test steps:
the inductive speed sensor,
the data line for transmitting the output signals of the sensor to the ABS control unit, as well as the connections of said data line to the sensor and the control unit,
the ABS control unit,
the data line for transmitting the signal representing the vehicle speed from the ABS control unit to the ASR control unit as well as the connections of said data line to the ABS control unit and ASR control unit, and
the ASR control unit itself.

If, in the foregoing example, the value of the vehicle speed derived in the ABS control unit is then passed via a data bus to the other control units, and if in this example a dataword indicates a malfunction of the control unit of the ASR and a second dataword indicates a malfunction of the control unit for controlling the internal-combustion engine in that the value of the speed is defective, the following are included as test steps in the list on the basis of the dataword of the ABR control unit:
the inductive speed sensor,
the data line for transmitting the output signals of the sensor to the ABS control unit, as well as the connections of said data line to the sensor and the control unit,
the ABS control unit,
the data bus for transmitting the signal representing the vehicle speed from the ABS control unit to the ASR control unit as well as the connections of said data line to the ABS control unit and ASR control unit, and
the ASR control unit.

On the basis of the data word of the control unit for controlling the internal-combustion engine, the following are included as test steps in the list:
the inductive speed sensor,
the data line for transmitting the output signals of the sensor to the ABS control unit, as well as the connections of said data line to the sensor and the control unit,
the ABS control unit,
the data bus for transmitting the signal representing the vehicle speed from the ABS control unit to the control unit for controlling the internal-combustion engine as well as the connections of said data bus to the ABS control unit and the control unit for controlling the internal-combustion engine.
the control unit for controlling the internal-combustion engine.

The foregoing test steps are then subdivided in the step 409 into steps which can be automatically checked by the analysis unit, and steps for which manual intervention is required.

In the above-mentioned examples, the test steps which can be carried out automatically include:
the ABS control unit,
the data bus for transmitting the signal representing the vehicle speed from the ABS control unit to the ASR control unit,
the ASR control unit,
the data line for transmitting the signal representing the vehicle speed from the ABS control unit to the ASR control unit,
the data bus for transmitting the signal representing the vehicle speed from the ABS control unit to the control unit for controlling the internal-combustion engine, and
the control unit for controlling the internal-combustion engine.

In order to check the connections of the data lines and of the data bus to the sensor, the ABS control unit, the ASR control unit and the control unit for controlling the internal-combustion engine, on the other hand, it is necessary to check the contacts with manual back-up.

In step 410 of the method according to the invention, test steps are eliminated from both parts of the list in such a way that each step is carried out only once. That is, a particular malfunction can cause the same test step to appear repeatedly in the list based on data words of a plurality of subassemblies. Consider in the third example set forth above, the following sources of error:
inductive speed sensor;
data line for transmitting the output signals of the sensor to the ABS control unit as well as the connections of said line to the sensor and the control unit;

ABS control unit; and

Data bus for transmitting the signal representing the vehicle speed from the ABS control unit to the corresponding further control unit.

A malfunction in any of the above peripheral subassemblies causes a malfunction to be detected in the value of the vehicle speed, both on the basis of the data word of the ASR control unit and on the basis of the data word of the control unit for controlling the internal-combustion engine. This results overall in the following list of test steps:

(1) the inductive speed sensor,
(2) the data line for transmitting the output signals of the sensor to the ABS control unit,
(3) the connections of the data line to the sensor and the control unit,
(4) the ABS control unit,
(5) the data bus for transmitting the signal representing the vehicle speed from the ABS control unit to the ASR control unit and the control unit for controlling the internal-combustion engine,
(6) the connection of the data bus to the ABS control unit,
(7) the connection of the data bus to the ASR control unit,
(8) the connection of the data bus to the control unit for controlling the internal-combustion engine,
(9) the ASR control unit, and
(10) the control unit for controlling the internal-combustion engine.

A sequence in which the above test steps are expediently to be executed, is subsequently fixed in the step 411. A more precise localization of the malfunction can be undertaken on the basis of a combination of the malfunctions represented by the data words of the individual subassemblies.

If, for example, in an arrangement according to the third example a malfunction is detected in the value of the vehicle speed on the basis both of the data word of the ASR control unit and of the data word of the control unit for controlling the internal-combustion engine, without a malfunction being detected in the value of the vehicle speed on the basis of the data word of the ABS control unit, it is probable that the data bus or the connection of the data bus to the ABS control unit is the cause of error. It is improbable that one of the sources of error to be tested in the test steps (1) to (4) is the cause of error, since then the data word of the ABS control unit would also have to indicate this malfunction. Furthermore, it is improbable for a combination of malfunctions to occur in the sources of error corresponding to the test steps (7) with (8) and/or (10) or (9) with (8) and/or (10), or (7) with (9) and (8) and/or (10). The sources of error corresponding to the test steps (5) and (6) therefore are considered as having the highest probability as the cause of error, since in the case of a malfunction in each of these sources of error alone the combination of the corresponding data words is produced.

The test steps can thus be divided into three groups having different probabilities. In the first group, a possible malfunction in the sources of error suffices, so that the combination of the data words of the subassemblies concerned is produced (test steps (5) and (6)). In the second group, specific combinations of malfunctions must be present in the individual sources of error, in order to explain the combination of the data words (test steps (7), (8), (9) and (10)). In the third group, an occurrence of a malfunction in the corresponding sources of error leads to an inconsistency with respect to the production of the data words, it being possible to explain individual data words and not to explain other data words, that is to say that the malfunction has not been detected in individual subassemblies in which it should have been detected there (test steps (1), (2), (3) and (4)). This advantageously results in the following sequence of test steps:

(5), (6) / (7), (8), (9), (10) / (1), (2), (3) and (4).

In step 412 of the invention, the test steps are reordered so that those which can be executed automatically by the analysis unit are carried out before the test steps which require manual intervention. This results in the following sequence of test steps:

(5), (6) / (9), (10), (7), (8) / (1), (2), (4) and (3).

Furthermore, it is possible in step 413 according to the invention to take into account empirical values which the analysis unit can obtain by means of a connection with the central computer. That is, individual test steps can be given preference depending on the probability of malfunction based on the frequency of the occurrence of malfunction in the past. The probabilities can be weighted so that malfunctions which are more remote in time receive a lower priority. Improvements of particular types of vehicles are thereby automatically taken into account. The frequency of occurrence of a malfunction in the past is acquired by the central computer by transmission from the analysis unit, upon conclusion of a repair, of all the rectified malfunctions in conjunction with the vehicle data (vehicle type, age, mileage, . . . ).

The test steps are executed in accordance with the determined sequence in the step 414, automatically if possible or through interactive dialogue between the user and the analysis unit. It is possible to proceed likewise when drawing up the list of test steps, as well.

Once any malfunctions have been corrected it is possible in accordance with the step 415 to call for the error-setting condition to be brought about (for example by a test drive). It is expedient for this purpose to store in the analysis unit the data words corresponding to the start of the repair, and to reset all data words of subassemblies concerned before the error-setting condition is brought about. Thereafter, the data words of the subassemblies are then evaluated in step 416, in order to test whether a corresponding malfunction has occurred once again. If not, it can be concluded that all causes of error have been found and removed with the removal of the malfunctions determined. Otherwise, the list of the test steps must be drawn up anew and executed once again, in order to locate and remove all causes of error. This type of execution of a test list is particularly expedient when it is to be expected that a malfunction will reoccur relatively quickly if the cause of error has not been removed completely. Since the vehicle speed is determined continuously, this is given in example.

In a further example, another malfunction can arise when the hydraulic system of the ABS does not function correctly because no pressure reduction takes place although correct output signals for driving the solenoid valves are generated by the ABS control unit. It is conceivable that driving conditions occur only relatively seldom in which the solenoid valve comes into use, and it would be correspondingly necessary in this case to cover a long distance in a test drive. It is then expedient either to execute the list completely or specifically to test the solenoid valve in a test drive in such a driving condition. For this purpose, a display which indicates the necessity of such a driving condition can then take place in the step 417.

In the last mentioned example, the list of test steps then consists of:

control line between the ABS control unit and the solenoid valve, connections of the control line to the ABS control unit and the solenoid valve, and solenoid valve.

In principle, the test steps can also be executed by indicating them on a display that is connected to the analysis unit or contained in it. For example, the device can be informed via a keyboard when a specific test step has been executed.

FIG. 5 shows step 501 of the method according to the invention for malfunctions, which occur only under specific operating conditions. In this case, a set of environmental data is specified, that is to say specific environmental data are required during a specific time interval. Depending on the volume of the environmental data to be stored, the scanning time for the measurement, and the period of time during which the measurement is to last, it is necessary to provide a specific memory location for this purpose, which can then, for example, be filled to 25 percent of its capacity with environmental data while the malfunction does not occur. This 25 percent can be filled, for example, according to the FIFO principle, that is to say that data first read in is also, in turn, first to be written over (First In First Out). If the malfunction occurs for the first time, the remaining 75% of the memory location is then filled. It may then be possible to conclude the cause of error from the time characteristic of the data.

Test steps are thus included in the list in such a way that all possible sources of a detected malfunction are completely checked. If, for example, a malfunction is detected in a control unit in a variable which is determined from at least one measured variable and is used to generate output signals at actuators, all the sensors of the corresponding measured variables, their data lines, as well as the connections of the data lines to the sensors and the control unit, and the control unit itself are included in the list as test steps. A similar result occurs when a data bus is used instead of the data lines. If, in another example, a correct output signal is generated in a control unit and the corresponding actuator does not respond, the data lines, the actuator and the connections of the data line to the actuator, and the actuator are included in the list. The list thus contains all subassemblies which come into question as a cause of error. A functional chain is thus determined, which contains all the subassemblies which come into question as a cause of error. Those subassemblies forming the sources of error are then checked by corresponding test steps.

Figure 6:
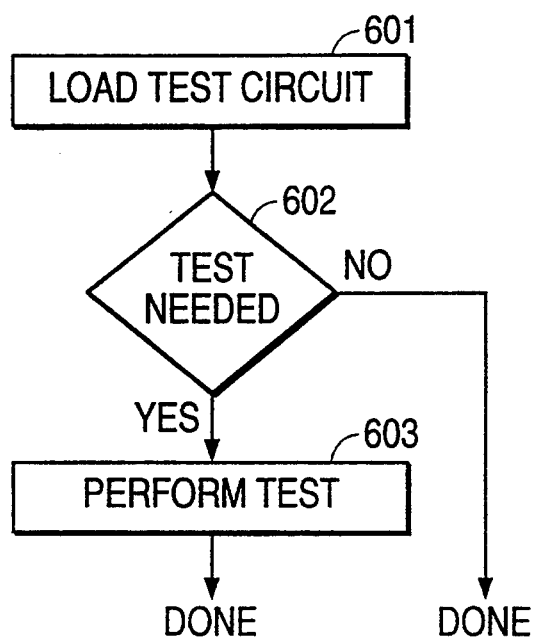

According to the representation of FIG. 6, subassemblies in which a malfunction occurring cannot be detected by another subassembly (i.e., does not lead to any corresponding change in a data word of a subassembly) are also checked. If, for example, a pneumatic line is to be checked for tightness, and if when driving a pump in the pneumatic circuit, pressure is built up and the pressure loss due to a leak (that is not too large) remains within limits such that the actuators are still nevertheless set in motion, it is not possible to detect the leak, and a pressure sensor is then necessary. If the installation of an appropriate pressure sensor in each vehicle is too expensive, a pressure sensor can be introduced into the pneumatic circuit at specific intervals during a stay in the workshop.

Thus, test steps for checking the corresponding circuit are carried out because a malfunction in the corresponding circuit cannot be detected by a data word of a subassembly. The term "circuit" is also to be understood here in the sense of a functional chain, that is to say that a specific level of control effects a change in a physical variable in the motor vehicle. It follows that the circuit in question also need not be a pneumatic circuit.

The loading of the corresponding circuit since its last test is determined in the step 601. This can be performed, for example, by determining how many kilometers have been covered since the last test of the corresponding circuit. Now, if a specific failure probability is known for each of the functional chains to be checked as a function of the kilometers covered, it is possible to derive in accordance with the steps 602 the need to undertake a test of the corresponding functional chain. A list is then drawn up in the step 603 of all test steps which are necessary in order to check the functional chain for its effectiveness, and which relate to subassemblies in which an occurrence of a malfunction cannot be detected by a data word of a subassembly.

Figure 7:
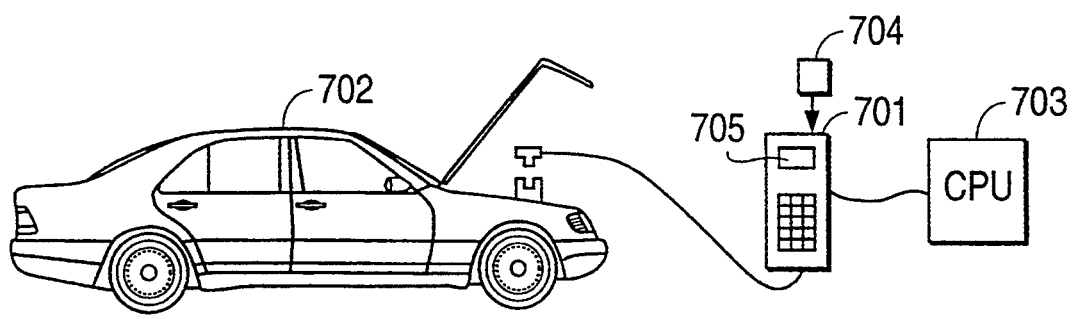
FIG. 7 is a schematic depiction which shows the fitting to a vehicle of a device for carrying out the method according to the invention.

FIG. 7 shows that the analysis unit 701 for carrying out the method is connected to a vehicle 702. As a result, it is also possible to transfer updatings of software to individual control units. If, for example, due to a model development of a type of vehicle the software of the control unit for controlling the internal-combustion engine is updated, the updated software can be transferred by means of a connection to a central computer 703, or by plugging a corresponding module 704 of the analysis unit into the control unit. The software present in the control unit is overwritten in the process. It may further be seen from FIG. 7 that the analysis unit has a display 705 on which the test steps to be carried out can be indicated.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. Method for determining causes of malfunctions in a motor vehicle having a plurality of subassemblies and means for communicating data words generated in said subassemblies to an analysis unit, said data words containing information concerning said malfunctions of said motor vehicle, said method comprising the steps of:

generating respective first data words in each subassembly in which a malfunction is detected;

generating respective second data words in each subassembly which is peripheral to a subassembly in which a malfunction is detected;

communicating said first and second data words to said analysis unit;

generating a functional chain in said analysis unit in response to said first and second data words, said functional chain comprising potential causes of said detected malfunctions;

generating a list of test steps in said analysis unit, said list comprising test steps to check said potential causes of said malfunctions, including potential causes of malfunctions which cannot be detected automatically by a subassembly and for which no data word is therefore formed;

storing said list of test steps;

executing said test steps;

checking said functional chain and locating causes of said malfunctions in said subassemblies;

generating and displaying remedial measures corresponding to said causes of said malfunctions; and optimizing a sequence of test steps in said list of test steps by eliminating redundant test steps in said list which occur due to listing of particular potential causes of malfunction more than a single time, whereby each test step is performed only once; and by executing first those test steps which relate to potential causes of malfunction for which probability of a malfunction is higher than for other potential causes of malfunction, and those which relate to a potential cause of malfunction which must be checked before further potential causes of malfunction can be checked.

2. Method according to claim 1, further including the step of self testing with regard to supply voltage and the serviceability of the analysis unit.

3. Method according to claim 1, wherein the analysis unit is provided with test programs and data by connection to a test module which contains programs and data for detecting causes of malfunctions of the motor vehicle.

4. Method according to claim 1, wherein the analysis unit is provided with programs and data for detecting causes of malfunctions of the vehicle by connection to a central computer which contains programs and data for a plurality of types of vehicles.

5. Method according to claim 1, wherein a consistency teat is performed using programs and data present in the analysis unit for checking the vehicle in order to establish whether the vehicle can be checked by the programs and data present in the analysis unit.

6. Method according to claim 1, wherein said checking of potential causes of malfunctions which cannot be detected automatically is performed based on probability of the occurrence of a malfunction for each respective one of said potential causes of malfunction, the probability being determined with the aid of programs and data stored in the central computer and being transferred to the analysis unit.

7. Method according to claim 1, wherein said checking of potential causes of malfunctions which cannot be detected automatically is performed in response to information concerning said functional chain since a most recent test thereof.

8. Method according to claim 1, wherein said probability is determined based on at least either frequency of occurrence of earlier malfunctions or combinations produced from the data words of the subassemblies.

9. Method according to claim 1, wherein said optimization of the sequence of said test steps in the list is performed by executing test steps that can be executed automatically by the analysis unit before test steps which require manual intervention.

10. Method according to claim 1, wherein said data words of the subassemblies are stored at the start of carrying out the method.

11. Method according to claim 1, wherein before the start of the execution of the test steps of the list, vehicle network voltage is checked in a specific range.

12. Method according to claim 10, further comprising the steps of:

resetting said data words generated by said subassemblies, after execution of a portion of the test steps in said list;

causing occurrence of conditions determined to cause malfunctions of said vehicle; and comparing then current data words generated by said subassemblies with said stored data words to establish whether all detected malfunctions have been rectified.

13. Method according to claim 1, wherein each of said data words contain at least one of: data concerning environmental conditions at a time of occurrence of a malfunction, a localization of the malfunction, frequency of the occurrence of a malfunction, and sporadically or permanently occurring malfunctions.

14. Method according to claim 13 wherein test steps for malfunctions which occur only under specific operating conditions are executed under said specific operating conditions.

15. Method according to claim 13, wherein in the case of sporadically occurring causes of malfunction a memory location for storing measured data is provided in the analysis unit, a first position of said memory location containing a data record of measured variables as long as the malfunction has not occurred during test operation of the vehicle, a remaining portion of the memory location containing a data record of measured variables immediately after the occurrence of the malfunction.

16. Method according to claim 1, wherein determined malfunctions and the causes thereof are transmitted after execution of the test steps of the list, from the analysis unit to the central computer.

17. Method according to claim 1, wherein software of control unit of the vehicle can be updated by the analysis unit.

* * * * *